United States Patent [19]

Courtney et al.

[11] 4,390,615
[45] Jun. 28, 1983

[54] COATING COMPOSITIONS

[76] Inventors: Robert W. Courtney, 8, Greenoak Rise, Biggin Hill, Kent; Stephen J. Parker, 33 Gillmans Rd., Orpington, Kent; Alan C. Threadgold, 23, Stuart Close, Swanley, Kent, all of England

[21] Appl. No.: 329,054

[22] Filed: Dec. 9, 1981

Related U.S. Application Data

[63] Continuation of Ser. No. 91,543, Nov. 5, 1979, abandoned.

[51] Int. Cl.³ .............................................. H05K 3/28
[52] U.S. Cl. .................................... 430/315; 427/96; 427/259; 228/118; 228/180 R; 430/329; 430/280
[58] Field of Search ...................... 430/280, 315, 321; 427/291, 259; 228/118, 180 R

[56] References Cited

U.S. PATENT DOCUMENTS

| Number | Date | Inventor | Class |
|---|---|---|---|
| 3,989,610 | 11/1976 | Tsukada et al. | 430/280 |
| 4,064,287 | 12/1977 | Lipson et al. | 427/96 |
| 4,108,803 | 8/1978 | Green et al. | 430/280 |
| 4,120,843 | 10/1978 | Ameen et al. | 427/259 |
| 4,136,225 | 1/1979 | Feit et al. | 427/96 |
| 4,169,732 | 10/1979 | Shipley | 427/96 |
| 4,171,974 | 10/1979 | Golda et al. | 430/280 |

FOREIGN PATENT DOCUMENTS

| Number | Date | Country |
|---|---|---|
| 1187652 | 4/1970 | United Kingdom . |
| 1343482 | 1/1974 | United Kingdom . |
| 1448643 | 9/1976 | United Kingdom . |
| 1456486 | 11/1976 | United Kingdom . |
| 1464287 | 2/1977 | United Kingdom . |
| 1489425 | 10/1977 | United Kingdom . |
| 1492919 | 11/1977 | United Kingdom . |
| 1512814 | 6/1978 | United Kingdom . |
| 1515861 | 6/1978 | United Kingdom . |

*Primary Examiner*—John D. Smith
*Attorney, Agent, or Firm*—Louis E. Marn; Elliot M. Olstein

[57] ABSTRACT

A coating composition, which is suitable for the production of photopolymerizable coatings on circuit boards for the production of solder resists, comprises:
  (a) an ethylenically unsaturated polymerizable reaction product of a polyepoxide and an ethylenically unsaturated carboxylic acid, which product is solid or semisolid in nature;
  (b) an inert inorganic filler, the filler and reaction product (a) having present in a weight ratio of from 20 to 65 parts of filler to from 80 to 35 parts of reaction product;
  (c) a photopolymerization initiator for the polymerizable reaction product; and
  (d) a volatile organic solvent for the polymerizable reaction product.

The compositions are applied to substrates, such as circuit boards, and allowed to dry by evaporation of organic solvent to produce a photopolymerizable coating on the substrate which coating may be cured by exposure to actinic radiation, for example through a patterned mask. The resultant cured material is resistant to hot solder and hence is suitable for use as a solder resist in the manufacture of printed circuit boards.

3 Claims, No Drawings

COATING COMPOSITIONS

This is a continuation, of application Ser. No. 091,543, filed Nov. 5, 1979 now abandoned.

This invention is concerned with improvements in and relating to coating compositions and more particularly is concerned with coating compositions for the production of photopolymerizable coatings upon substrates.

In order to provide for the attachment of electrical components to a printed circuit board of the type comprising a patterned layer of an electroconductive metal (generally copper) on an electrically non-conductive substrate (generally a plastics impregnated substrate) a patterned layer of a solder resist is applied to the board so as to expose parts of the patterned metal layer and the so-coated board is contacted with molten solder so that the solder adheres to the patterned metal layer at the exposed portions thereof. Generally, before the board is contacted with the solder, the electrical components are placed on the other side of the board with conducting elements extending therefrom passing through holes in the board into the exposed portions of the patterned metal layer.

It has now been found, in accordance with the present invention, that a patterned solder resist may be formed from a photopolymerizable composition containing a solid or semi-solid reaction product of a polyepoxide and an ethylenically unsaturated carboxylic acid, a photopolymerization initiator therefor and an inert inorganic filler, by exposing a layer of the composition to actinic radiation through a suitable transparent substrate bearing an opaque image.

According to one embodiment of the invention, therefore, there is provided a coating composition, for the production of photopolymerizable coatings, comprising:

(a) an ethylenically unsaturated polymerizable reaction product of a polyepoxide and an ethylenically unsaturated carboxylic acid, which product is solid or semi-solid in nature;

(b) an inert inorganic filler, the said filler and the said reaction product being present in a ratio of from 20 to 65 parts by weight of filler to from 80 to 35 parts by weight of reaction product;

(c) a photopolymerization initiator for the said polymerizable reaction product; and (d) a volatile organic solvent for the said polymerizable reaction product.

The invention also provides a method of forming a photopolymerizable coating upon a substrate which comprises applying a coating of a coating composition as defined above to the substrate and allowing it to dry by evaporation of volatile organic solvent.

A principal ingredient of the coating compositions of the invention is the reaction product of a polyepoxide and an ethylenically unsaturated carboxylic acid, generally acrylic acid or methacrylic acid, and which will hereinafter simply be referred to as an "epoxy acrylate." The epoxy acrylate should be solid or semi-solid at ambient temperature, e.g. should have a ring and ball softening point (determined according to British Standard Specification No. 4692 of 1971) of at least 5° C., preferably at least 30° C. The epoxy acrylate is one derived from the reaction of a polyepoxide and an ethylenically unsaturated carboxylic acid or reactive derivative thereof. The polyepoxide should be an aromatic polyepoxide and any such polyepoxide may be employed provided that the reaction product thereof with the ethylenically unsaturated acid is a solid or semi-solid at ambient temperatures. Aromatic polyepoxides are polyepoxides containing phenyl groups (polyphenyl polyepoxides) such as polyepoxides derived from the reaction of bisphenols, especially polynuclear bisphenols such as bisphenol-A, with epichlorohydrin, or epoxidised phenyl novolacs, the former being generally preferred. Aromatic polyepoxides are well known materials and are described, for example in "Chemistry of Organic Film Formers," Soloman D. H., 2nd Edition, Krieger Publishing, 1977, at page 188, 189 and 192. Suitable epoxy acrylates may be prepared by reacting a polyepoxide derived from the reaction of bisphenol A and epichlorohydrin and having a molecular weight of from 400 to 1500, preferably from 400 to 850, with a $C_3$-$C_6$ alpha, beta-ethylenically unsaturated monocarboxylic acid.

The second principal ingredient of the compositions of the invention is an inert inorganic filler. The filler, which will be in powdered or finely divided form, serves to improve the resistance of the composition, when used as a solder resist, to heat or thermal shock such as is experienced when the cured composition is brought into contact with molten solder. The filler should, when the coating composition is employed in the production of a solder resist, not be one which undergoes thermal decomposition when heated by contact with molten solder and examples of suitable fillers include blanc fixe, aluminium hydrate, china clay, calcium carbonate (coated or uncoated) and micronised talc, or mixtures thereof. The weight ratio of filler to epoxy acrylate is from 20–65:80–35, preferably from 25–55:75–45, more preferably from 30–45:70–55.

In general, in order to provide a generally tack-free coating from the composition (as is described below), it is preferable, when using less solid epoxy acrylates (i.e. those having lower softening temperatures), to employ higher levels of inorganic fillers, but, of course, within the broad range noted above.

The photopolymerization initiator used in the compositions of the invention serves to induce polymerization of the epoxy acrylate when the composition, after application to a substrate, is subjected to actinic radiation. A wide variety of such photopolymerization initiators are known in the art, such as benzoin ethers and anthraquinone derivatives. Preferred initiators for use in the compositions of the invention are phenyl ketone initiators such as benzophenone, acetophenone or Mischlers ketone or mixtures thereof. The initiator is suitably present in the composition in an amount of from 1 to 20% by weight, preferably from 5 to 15% by weight, based on the weight of the epoxy acrylate.

The compositions of the invention also contain a volatile organic solvent for the epoxy acrylate, with the epoxy acrylate dissolved therein, and examples of such solvents include lower carboxylic acid ester of lower alcohols (e.g. isopropyl acetate), lower dialkyl ethers (such as diethyl ether), ketones (such as acetone or methyl ethyl ketone), or, preferably, hydroxyalkyl ethers such as those sold under the trade names "Cellosolve" or "Butyl Cellosolve" (ethylene glycol monoethyl ether and ethylene glycol monobutyl ether).

The amount of organic solvent present in a coating composition of the invention as applied to a substrate (e.g. a printed circuit board) will, to some extent, depend upon the nature of the method by which the composition is to be applied to the substrate. Thus, where the composition is to be applied to a substrate by, for example, a screen printing process, it may contain up to 50% by weight of volatile organic solvent whereas if it is to be applied to the substrate by a curtain coating process it may contain up to 75% by weight of volatile organic solvent. The compositions of the invention may conveniently be formulated containing a lower amount of solvent than is required in the actual application process, the additional solvent required being added to the composition to dilute it prior to the application process. In any case the composition should contain sufficient volatile organic solvent to dissolve the epoxy acrylate and, before dilution as described above, suitably contains up to 35% by weight of volatile organic solvent.

The coating compositions of the invention also suitably contain a colorant, for example an organic pigment such as a chlorinated phthalocyanine pigment, in order that the application of the composition to a substrate provides a visible image. Suitably such colorants will be present in amounts of up to 5% by weight, based on the weight of epoxy acrylate, filler and initiator, preferably from 0.5-2% by weight thereof. The coating compositions of the invention may also contain antifoaming agents, such as silicone oils, in order to improve their application properties and such antifoaming agents may be present in amounts similar to those given above for the coloring agents.

Whilst the compositions of the invention contain the epoxy acrylate as principal photopolymerizable ingredient, other photopolymerizable materials may be present and examples of such include esters of mono- or polyhydric alcohols with ethylenically unsaturated carboxylic acids such as acrylic or methacrylic acid, and liquid epoxy acrylates. Such other photopolymerizable materials are not, however, essential and when used it is preferred that they be employed in minor amounts as compared with the epoxy acrylate, e.g. in amounts of less than 25%, preferably less than 10%, of the weight of the solid or semi-solid epoxy acrylate.

A coating composition of the invention is used to form a photopolymerizable coating upon a substrate by applying it to the substrate by any convenient method, such as screen printing, curtain coating or roller coating, and then allowing the applied coating to dry to a tack-free condition (i.e. to a condition such that it does not adhere to a surface with which it may come into contact) and generally this drying will be accelerated by heating the applied coating.

The resultant coating may be polymerized by exposure to actinic radiation, for example from a source such as a mercury vapour lamp.

As indicated above, a polymerizable coating obtained from a coating composition of the invention is particularly suitable for use in the production of a solder resist in a process for the manufacture of a printed circuit board.

Accordingly, a further embodiment of the invention provides a method of forming a pattern of solder upon a layer of an electrically conductive metal supported on an electrically non-conductive substrate by providing the metal layer with a patterned resist coating, whereby portions of the metal layer are coated with the solder resist coating and other portions of the metal layer are not so coated, and contacting the metal layer provided with the solder resist coating with molten solder whereby solder adheres to the portions of the metal layer not coated with the solder resist coating, in which the solder resist coating is formed by polymerizing, by exposure to actinic radiation, a photopolymerizable coating obtained by applying a coating composition in accordance with the invention to the metal layer and allowing it to dry.

One such process comprises the steps of:

(a) providing a circuit board having a patterned layer of a conductive metal (hereinafter simply referred to as copper) with a coating of a coating composition of the invention, at least over the copper layer, for example by screen printing process or by a curtain coating process, in which latter case the coating of the composition will extend over the whole of the surface of the board;

(b) allowing the coated composition to dry to a tack-free state, i.e. by evaporation of volatile organic solvent therefrom;

(c) exposing the coated board to actinic radiation through a positive for the desired solder pattern (i.e. a transparency, generally a photographic transparency, having light transmitting portions corresponding to the non-solderable portion of the desired solder pattern and non-transmitting portions corresponding to the solderable portions of the desired solder pattern) to cure the exposed portions of the coating, i.e. to photopolymerize the photomerizable material therein;

(d) removing the non-exposed portions of the coating by means of a solvent therefor, e.g. a ketone such as cyclohexanone or a halogenated organic solvent such as methylene chloride or or trichloroethylene; and (e) contacting the board having a patterned coating image with molten solder, e.g. in the form of a so-called "standing wave" of solder, to apply solder to the board in the desired pattern.

This process makes it possible to provide circuit boards with a patterned solder resist of high definition and accuracy since, in general, exposure through a positive to actinic radiation provides for good accuracy and definition which is of importance as the overall size of circuit boards, and hence the size of individual parts of the solder resist pattern, decrease, a tendency which has been noted recently.

The circuit board having a patterned layer of copper thereon used as starting material in step (a) of the process described above may be produced in a number of ways, either by the so-called "subtractive" method or by the so-called "additive" method.

In the subtractive method a laminate comprising a layer of copper on a non-conducting substrate is first provided with a positive patterned image of an acid-resisting coating and the exposed copper is then etched away with a suitable acid (e.g. hydrochloric acid), the remaining copper then being exposed by removal of the acid-resisting coating. A coating of acid-resistant material may, as is wellknown, be applied by a patterned coating method, such as a screen printing method, or by coating the copper with a layer of a photosensitive composition and subsequently exposing this to light through a positive or negative image of the desired copper layer, depending on whether the resist coating is a so-called positive or negative working resist and subsequently removing the developable (i.e. solvent-soluble) portions of the image with a suitable solvent. The compositions of the invention are, themselves, perfectly suitable for use as negative working resists, i.e. resists the exposed portions of which are cured to give an insoluble coating. Thus, the circuit boards having a patterned layer of copper on the surface thereof may be provided by firstly coating a copper-clad substrate with a coating composition of the invention, allowing the coating to dry, exposing the dried coating to actinic radiation through a positive of the desired copper layer patter to cure the portion of the coating exposed to radiation, removing the uncured portion of the coating with a solvent therefor and subsequently etching the coated board. The cured coating may then be removed by washing with a solvent therefor, e.g. N-methyl-pyrrolidone. The board may then be provided with a patterned solder coating as described above.

Dried but uncured coatings of the composition of the invention are resistant to the acid etches used to remove the copper and hence the circuit board having a patterned image of copper thereon may be produced by printing (e.g. by a screen printing process) a patterned coating of a composition of the invention on to a copper clad non-conducting substrate, allowing the coating to dry, and the etching exposed copper from the board. In order to provide a patterned solder coating on the resultant board it is then merely necessary to expose the board to actinic radiation through a positive of the solder pattern (as described in step (c) above) without applying a further coating of a composition of the invention and then proceeding as described in steps (d) and (e) above. Hoever, if desired a further coating of a composition of the invention may be applied to the board before exposure to actinic radiation in the manner described in step (c) above.

In the additive method for the preparation of the board having a patterned layer of copper, a non-conductive substrate is first coated with an activating material for a so-called electroless copper plating solution, the board is then provided with a negative patterned image of a resist coating, and the board is then immersed in an electroless copper plating solution to form a layer of copper on the exposed portions of the board, i.e. those not covered with the resist. Here again the composition of the invention may be used to form the resist layer, for example by coating the activated board with a layer of the coating composition, allowing it to dry and exposing it to actinic radiation through an appropriate positive of the circuit pattern so that the exposed portion of the coating is photohardened, the non-exposed portion subsequently being removed with a suitable solvent.

Whilst the compositions of the invention are photosensitive, they are not effectively sensitive to subdued light or light having a wavelength above 420 nanometers. Thus the initial application of the coating composition to a substrate can be carried out in the light (although of course not light having a high amount of actinic radiation).

In order that the invention may be well understood the following examples are given by way of illustration only. In the examples all parts and percentages are by weight unless otherwise stated.

PREPARATIVE EXAMPLE A

Preparation of epoxy acrylate 86.3 Parts of a bisphenol-A/epichlorohydrin polyepoxide solid under the trade name "Epikote 1001" were placed in a reaction vessel fitted with a stirrer and heated therein to melt the polyepoxide. Then 13.7 parts of glacial acrylic acid (in admixture with 0.25%, based on the total weight of polyepoxide and acid, of triphenyl phosphine and 0.2%, based on the total weight of polyepoxide and acid, of a phenolic polymerization inhibitor) were added to the vessel.

The reaction mixture was stirred at 120°–130° C. until the acid value of the mixture had fallen to 10 mg KOH/gm (97 hours at 125° C.). The product was then discharged from the vessel and cooled and at room temperature was a solid having a ring and ball softening point of 64°–67.5° C.

PREPARATIVE EXAMPLE B

Following the procedure of Preparative Example 1, one epoxy equivalent of a commercially available epoxy novolak resin (Dow Epoxy Novolak DEN 438) was reacted with one equivalent of glacial acrylic acid to an acid value of 8.5 mg KOH/gm. The product was a viscous semisolid having a ring and ball softening point of about 10° C.

EXAMPLE 1

60 Parts of the product of Example A were dissolved in 40 parts of butyl Cellosolve to give an ink vehicle I.

A resist ink was made up from the following:
Phthalo green pigment: 0.5 parts
Micronised talc: 20.0 parts
Vehicle I: 73.5 parts
Irgacure 651 (A photopolymerization initiator manufactured by Ciba-Geigy; dimethoxyphenyl acetophenone): 5.0 parts
Silicone MS 200/100 (A silicone antifoam manufactured by Dow Corning Limited).: 1.0 parts The ink was diluted with 5% of Butyl Cellosolve and applied, by screen printing, using a screen having 77 mesh/cm, over the whole surface of a clean copper clad epoxy laminate on which the copper was already in the form of a circuit pattern. The coated laminate was placed in an infrared drier for 5 minutes (at 120° C.) in order to render the coating tack free. Once dried, a positive of the required solder pattern was placed over the coating and the resultant combination was exposed to ultra-violet radiation in order to harden the coating by passing it under two 80 watt/cm medium pressure mercury vapour lamps at a rate of 160 cm/min. Once hardened, the positive was removed and the solder pattern was developed by washing with trichloroethylene. Finally the board was fluxed (using CECM Solders 'Superspeed 17' flux) and dried. The fluxed board was then passed over a standing wave of molten solder at about 260° C.

An excellent result was obtained, the solders pads were accurately positioned, and the coating resisted soldering well.

EXAMPLE 2

70 Parts of Beckopox VEM 37/1 (a commercially available solid epoxy acrylate having a ring and ball softening point of 58°–63° C.) were dissolved in 30 parts of Butyl Cellosolve to give an ink vehicle II.

A resist ink was made up from the following:
Phthalo green pigment: 1.0 parts
Blanc fixe: 25.0 parts
Vehicle II: 69.0 parts
Mischlers ketone: 1.0 parts
Benzophenone: 3.0 parts
Silicone oil: 1.0 parts The ink was diluted with 15% of Butyl Cellosolve and applied to a clean copper clad phenolic laminate, by a screen printing process, through a patterned screen having 77 mesh/cm, to produce an image of the required circuit pattern. This coating was dried by stoving at 120° C. for 4 mins. The board was placed in an acid etchant bath (17 parts concentrated hydrochloric acid, 3 parts 100 volume hydrogen peroxide solution, 80 parts tap water) at 40° C. to remove unwanted copper and the board was rinsed and dried. The coating resisted the acid etchant, and gave very clean track edges.

The resultant board, with copper in the pattern of the circuit already coated with the composition, was placed, along with a positive of the required solder pattern, in an exposure frame and exposed to ultraviolet radiation as described in Example 1. The exposed coating was developed, after removal of the positive by washing with methylene chloride. The board was fluxed as described in Example 1 and passed over a standing wave of molten solder at 260° C. The solder pads were accurately positioned, and the coating resisted solder.

EXAMPLE 3

65 Parts of the product of Example A were dissolved in 35 parts of Cellosolve to give a vehicle III.
A resist ink was made up from the following:
Phthalo green pigment: 1.0 parts
Micronised talc: 12.0 parts
Alumina hydrate: 12.0 parts
Vehicle III: 69.0 parts
Benzil (A photoinitiator manufactured by A.B.M. Chemicals): 5.0 parts
Antifoam A (A silicone oil manufactured by Dow Chemicals).: 1.0 parts The ink was diluted with 10% of Cellosolve and then used as described in Example 1 to obtain substantially the same results.

EXAMPLE 4

60 Parts of Beckopox VEM 37/1 were dissolved in 40 parts of Butyl Cellosolve to give an ink vehicle IV.
A resist ink was made up from the following:
Phthalo green pigment: 0.5 Parts
Micronised talk: 30.0 parts
Vehicle IV: 63.5 parts
Irgacure 651: 5.0 parts
Silicone antifoam: 1.0 parts The ink was diluted with 10% of Butyl Cellosolve and screen printed using a 77 mesh/cm screen over the whole surface of a clean cooper clad phenolic laminate. The coating was drien in an I.R. drier (at 120° C.) and then placed in an exposure frame with a negative of the required circuit pattern. This was exposed to ultraviolet radiation as described in Example 1 and non-exposed areas of coating were developed, after removal from the frame by washing with methylene chloride.

The board was then placed in an acid etchant bath (as described in Example 2) at 40° C. which removed the exposed copper. After rinsing and drying the board base copper circuit coated with a hardened layer of the composition. The coating resisted etching, and gave very clean track edges. The board was soaked in a bath of N-methyl pyrrolidone and the cured coating removed.

The board was then cleaned, and screen printed again, using a 77 mesh/cm screen, with a coating of the ink over the whole surface of the board. The coated board was dried as above, and placed in contact with a positive of the required solder pattern in the exposure frame in which it was exposed to ultraviolet radiation as described above. The unexposed areas of coating were developed by washing with methylene chloride.

The developed board was then fluxed as described in Example 1 and passed over a standing wave of molten solder at 260° C. The resultant board had accurate track lines, and solder pad positions. The coating withstood soldering, with no signs of breakdown.

EXAMPLE 5

An ink was made up from the following:
Product of Preparative Example B: 48.5%
Phthalo green pigment: 0.5%
Micronised talc: 30.0%
Butyl cellosolve: 15.0%
Irgacure 651: 5.0%
Silicone oil: 1.0%

The ink was used as described in Example 1 except that the fluxed board was soldered by dipping it into a bath of molten tin/lead solder, maintained at 260° C., for 10 seconds. The cured coating exhibited good solder resistance.

EXAMPLES 6 and 7

Inks were made up to the following formulations:

|  | Example 6 | Example 7 |
|---|---|---|
| Phthalo green pigment | 0.5% | 0.5% |
| Micronised talc | 30.0% | 30.0% |
| Vehicle II (as described in Example 4) | 53.5% | 58.5% |
| Liquid acrylate 1* | 10.0% | — |
| Liquid acrylate 2** | — | 5.0% |
| Irgacure 651 | 5.0% | 5.0% |
| Silicone oil | 1.0% | 1.0% |

*Liquid acrylate 1 was a triacrylate of an oxypropylated trimethylol propane.
**Liquid acrylate 2 was the reaction product obtained, following the procedure of Preparative Example A, by reacting 0.35 epoxy equivalents of an 11% solution of a bisphenol A/epichlorohydrin polyepoxide in butyl glycidyl ether with 0.33 equivalents of glacial acrylic acid.

Each of the ink was used as described in Example 5 and showed good solder resistance.

We claim:
1. A method of forming a pattern of solder upon a layer of an electrically conductive metal supported on an electrically non-conductive substrate by providing the metal layer with a patterned solder resist coating, whereby portions of the metal layer are coated with the solder resist coating and other parts of the metal layer are not so coated, and contacting the metal layer provided with the solder resist coating with molten solder whereby solder adheres to the portions of the metal layer not coated with the solder resist coating, in which the solder resist coating is formed by polymerizing, by image-wise exposure to actinic radiation, a photopolymerizable coating and wherein unexposed portions of said photopolymerizable coating is removed by a solvent, the improvement consisting essentially of the steps of:
 (1) applying a coating composition comprising:
  (a) an ethylenically unsaturated polymerizable reaction product of an aromatic polyepoxide and an ethylenically unsaturated carboxylic acid and principally expoxy acrylate, which product is solid or semi-solid in nature;
  (b) an inert inorganic filler, the said filler and the said polymerizable raaction product being pres- ent in a weight ratio of from 20 to 65 parts by weight of filler to from 80 to 35 parts by weight of polymerizable reaction product;
(c) a photopolymerization initiator for the said polymerizable reaction product; and
(d) a volatile organic solvent for the said polymerizable reaction product;
(2) allowing said coating composition to dry; and
(3) removing said unexposed positions of said polymerizable coating.

2. A method according to claim 1, in which the patterned solder resist is obtained by exposing a coating of the photopolymerizable composition to actinic radiation through a patterned mask so that portions of the coating exposed to the radiation are polymerized and portions not exposed to the radiation are not polymerized, and subsequently removing the non-exposed portions of the coating by dissolving them in a solvent therefor.

3. The process as defined in claim 1 wherein said polymericable reaction product has a softening point of at least 5° C.

* * * * *